(12) United States Patent
Agrawal et al.

(10) Patent No.: US 6,282,500 B1
(45) Date of Patent: Aug. 28, 2001

(54) ACCUMULATED PHASE MEASUREMENT USING OPEN-LOOP PHASE ESTIMATION

(75) Inventors: Avneesh Agrawal, Sunnyvale; Rajiv Vijayan, San Diego, both of CA (US); Nadav Levanon, Ramat-Gan (IL)

(73) Assignee: Qualcomm Inc., San Diego, CA (US)

( * ) Notice: Subject to any disclaimer, the term of this patent is extended or adjusted under 35 U.S.C. 154(b) by 0 days.

(21) Appl. No.: 09/149,467

(22) Filed: Sep. 9, 1998

(51) Int. Cl.[7] .................................................. H04B 1/10
(52) U.S. Cl. ............................ 702/72; 702/190; 375/326
(58) Field of Search ........................... 702/72, 190, 191, 702/195; 375/325, 329, 326, 306, 279, 355, 344, 226–227

(56) References Cited

U.S. PATENT DOCUMENTS 5,473,637  12/1995  Gardner ............................... 375/329
5,572,551  11/1996  Kearney et al. ..................... 375/326
5,732,111  3/1998  Walley ................................. 375/344
5,914,985  * 6/1999  Ishizu .................................. 375/326

FOREIGN PATENT DOCUMENTS 0373517  6/1990  (EP) ............................ H03L/7/093
0763919  3/1997  (EP) ............................ H04L/27/233

* cited by examiner

*Primary Examiner*—Kamini Shah
(74) *Attorney, Agent, or Firm*—Philip R. Wadsworth; Gregory D. Ogrod

(57) ABSTRACT

An apparatus and method for generating an accumulated phase measurement of a communications signal over a predetermined time interval. A frequency estimate of the signal is generated; the frequency estimate is then converted to a coarse phase measurement. A phase error is generated based on the frequency estimate; the phase error is then converted to a fine phase measurement. The coarse and fine phase measurements are summed to yield an accumulated phase measurement.

16 Claims, 7 Drawing Sheets

ACCUMULATED PHASE MEASUREMENT USING OPEN-LOOP PHASE ESTIMATION

BACKGROUND OF THE INVENTION

I. Field of the Invention

The present invention relates generally to measuring characteristics of communications signals, and more specifically to obtaining an accumulated phase measurement of a communications signal.

II. Related Art

In general, wireless communications systems can be terrestrial or satellite-based. An example terrestrial wireless communications system includes at least one terrestrial base station and at least one user terminal (for example, a mobile telephone). The base station provides links from a user terminal to other user terminals or communications systems, such as a terrestrial telephone system. An example satellite-based wireless communications system includes at least one terrestrial base station (hereinafter referred to as a gateway), at least one user terminal (for example, a mobile telephone), and at least one satellite for relaying communications signals between the gateway and the user terminal. The gateway provides links from a user terminal to other user terminals or communications systems, such as a terrestrial telephone system.

In such wireless communications systems, the need often arises for a receiver to obtain a measurement of the frequency of a received communications signal. For some applications, a high degree of accuracy is required. One such application is the determination of the location of a user terminal based on the characteristics of communications signals received by the user terminal.

Such frequency measurements are usually taken using an automatic frequency control (AFC) loop in a receiver. However, these measurements are generally of low accuracy. Current AFC techniques measure only "current" phase error, and so achieve phase error accuracy on the order of hundreds of degrees. In wireless communications system employing low signal to noise ratios, such as spread spectrum systems, this accuracy is insufficient. While low accuracy frequency measurements are adequate for acquisition and tracking, higher accuracy is required for applications such as position determination. What is needed is a way to measure phase error with an accuracy on the order of tens of degrees.

One approach to reducing this error is to increase the loop iteration period of the AFC loop (for example, by increasing the period of its integrate-and-dump accumulators). However, this adversely affects acquisition and tracking. For example, if the loop iteration period is increased so as to achieve a standard deviation on the order of 1 Hz, the acquisition time (that is, the time the user terminal requires to acquire the signal) grows to an order of several minutes. Mobile phone users will not tolerate such a delay.

What is needed, therefore, is a system and method for making accurate measurements of the frequency of a received signal in a wireless communications system without adversely affecting other aspects of user terminal performance.

SUMMARY OF THE INVENTION

The present invention is a novel and improved apparatus and method for accurately measuring the accumulated phase of an input signal over a given time interval.

The apparatus includes an automatic frequency control loop for generating a frequency estimate of the frequency of the input signal; a phase error estimator for generating a phase error based on the frequency estimate; and a phase detector for generating an accumulated phase measurement based on the frequency estimate and the phase error.

One advantage of the present invention is that it permits high-accuracy frequency measurements of a signal in a communications system.

Another advantage of the present invention is that its robust open-loop architecture is well-suited for use with communications signals subject to fading.

A further advantage of the present invention is that it employs a cascaded architecture that permits the use of an off-the-shelf automatic frequency control loop in the present invention without significant modification.

BRIEF DESCRIPTION OF THE FIGURES

The features, objects, and advantages of the present invention will become more apparent from the detailed description set forth below when taken in conjunction with the drawings in which like reference characters identify correspondingly throughout and wherein.

DETAILED DESCRIPTION OF THE PREFERRED EMBODIMENTS

I. Introduction

Preferred embodiments of the present invention are discussed in detail below. While specific steps, configurations and arrangements are discussed, it should be understood that this is done for illustrative purposes only. After reading this description, it will become apparent to one skilled in the relevant art that other steps, configurations and arrangements can be used without departing from the spirit and scope of the present invention.

The present invention is described in two parts. First, an exemplary wireless communications system is described. Second, a system is described for obtaining an accumulated phase measurement of a signal in a satellite communications system according to preferred embodiments of the present invention. The present invention can be used in other types of communications systems, as would be apparent to one skilled in the relevant art.

II. An Exemplary Wireless Communications System

Before describing the present invention in detail, it is useful to provide a simplified description of an exemplary wireless communications system in which the invention can be implemented.

Figure 1:
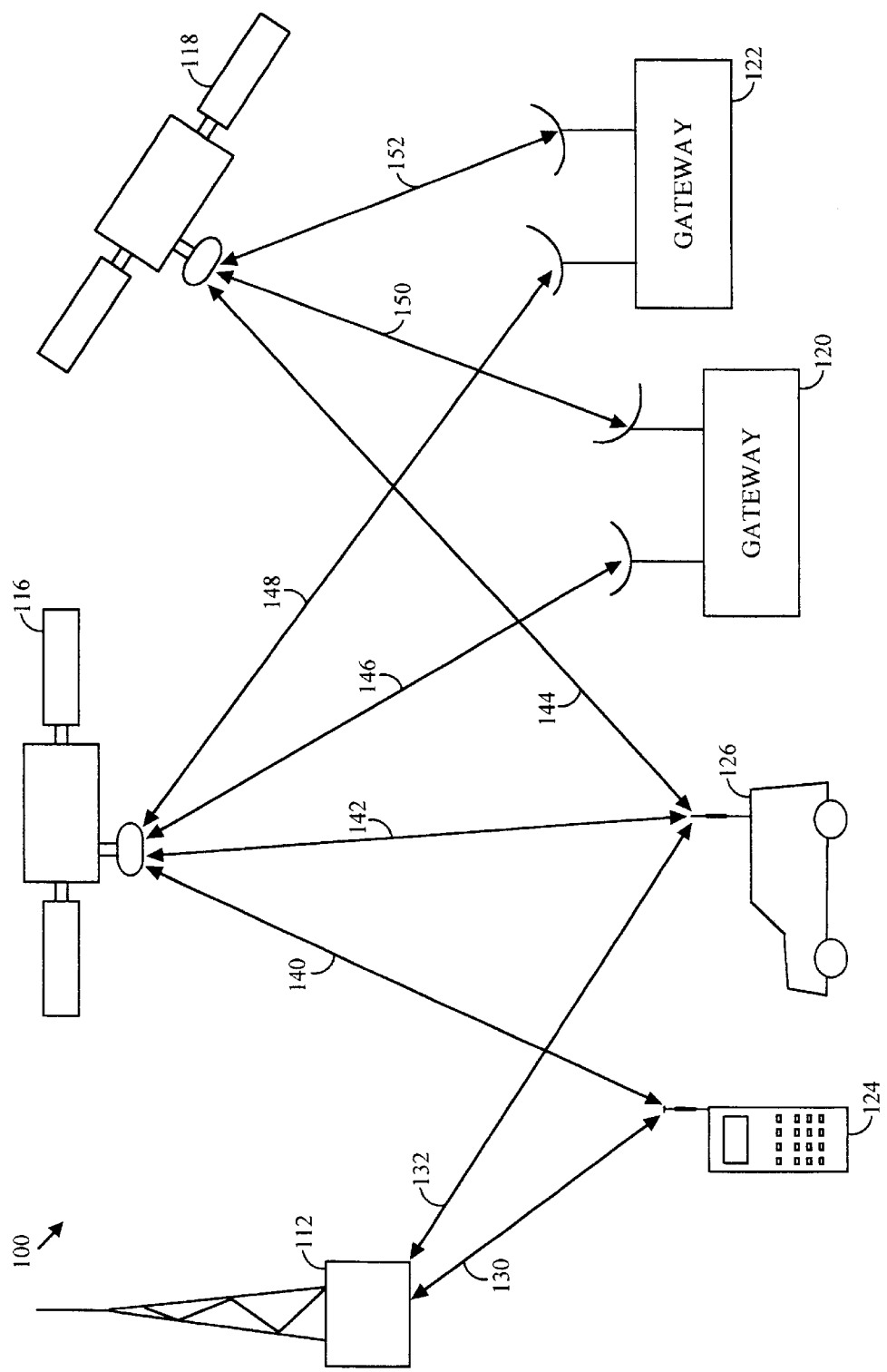
FIG. 1 depicts an exemplary wireless communication system.

An exemplary wireless communication system in which the present invention is useful is illustrated in FIG. 1. It is contemplated that this communication system uses CDMA type communication signals, but this is not required by the present invention. In a portion of a communication system 100 illustrated in FIG. 1, one base station 112, two satellites 116 and 118, and two associated gateways or hubs 120 and 122 are shown for effecting communications with two remote user terminals 124 and 126. Typically, the base stations and satellites/gateways are components of separate communication systems, referred to as being terrestrial- and satellite-based, although this is not necessary. The total number of base stations, gateways, and satellites in such systems depend on desired system capacity and other factors well understood in the art.

The terms "base station" and "gateway" are sometimes used interchangeably in the art, with gateways being perceived as specialized base stations that direct communications through satellites and have more 'functions,' with associated equipment, to establish and maintain such communication links through moving repeaters, while base stations use terrestrial antennas to direct communications within a surrounding geographical region. Central control centers will also typically have more functions to perform when interacting with gateways and satellites. User terminals are also sometimes referred to as subscriber units, mobile units, mobile stations, or simply "users," "mobiles," or "subscribers" in some communication systems, depending on preference.

User terminals 124 and 126 each include a wireless communication device such as, but not limited to, a cellular telephone, a data transceiver, or a paging or position determination receiver, and can be hand-held or vehicle-mounted as desired. Here, the user terminals are illustrated as hand-held telephones. However, it is also understood that the teachings of the invention are applicable to fixed units where remote wireless service is desired, including "indoor" as well as "open air" locations.

Generally, beams from satellites 116 and 118 cover different geographical areas in predefined patterns. Beams at different frequencies, also referred to as CDMA channels or "sub-beams," can be directed to overlap the same region. It is also readily understood by those skilled in the art that beam coverage or service areas for multiple satellites, or antenna patterns for multiple base stations, might be designed to overlap completely or partially in a given region depending on the communication system design and the type of service being offered, and whether space diversity is being achieved.

A variety of multi-satellite communication systems have been proposed with an exemplary system employing on the order of 48 or more satellites, traveling in eight different orbital planes in LEO orbits for servicing a large number of user terminals. However, those skilled in the art will readily understand how the teachings of the present invention are applicable to a variety of satellite system and gateway configurations, including other orbital distances and constellations. At the same time, the invention is equally applicable to terrestrial-based systems of various base station configurations.

In FIG. 1, some possible signal paths are illustrated for communications being established between user terminals 124 and 126 and base station 112, or through satellites 116 and 118, with gateways 120 and 122. The base station-user terminal communication links are illustrated by lines 130 and 132. The satellite-user terminal communication links between satellites 116 and 118, and user terminals 124 and 126 are illustrated by lines 140, 142, and 144. The gateway-satellite communication links, between gateways 120 and 122 and satellites 116 and 118, are illustrated by lines 146, 148, 150, and 152. Gateways 120 and 122, and base station 112, may be used as part of one or two-way communication systems or simply to transfer messages or date to user terminals 124 and 126.

Figure 2:
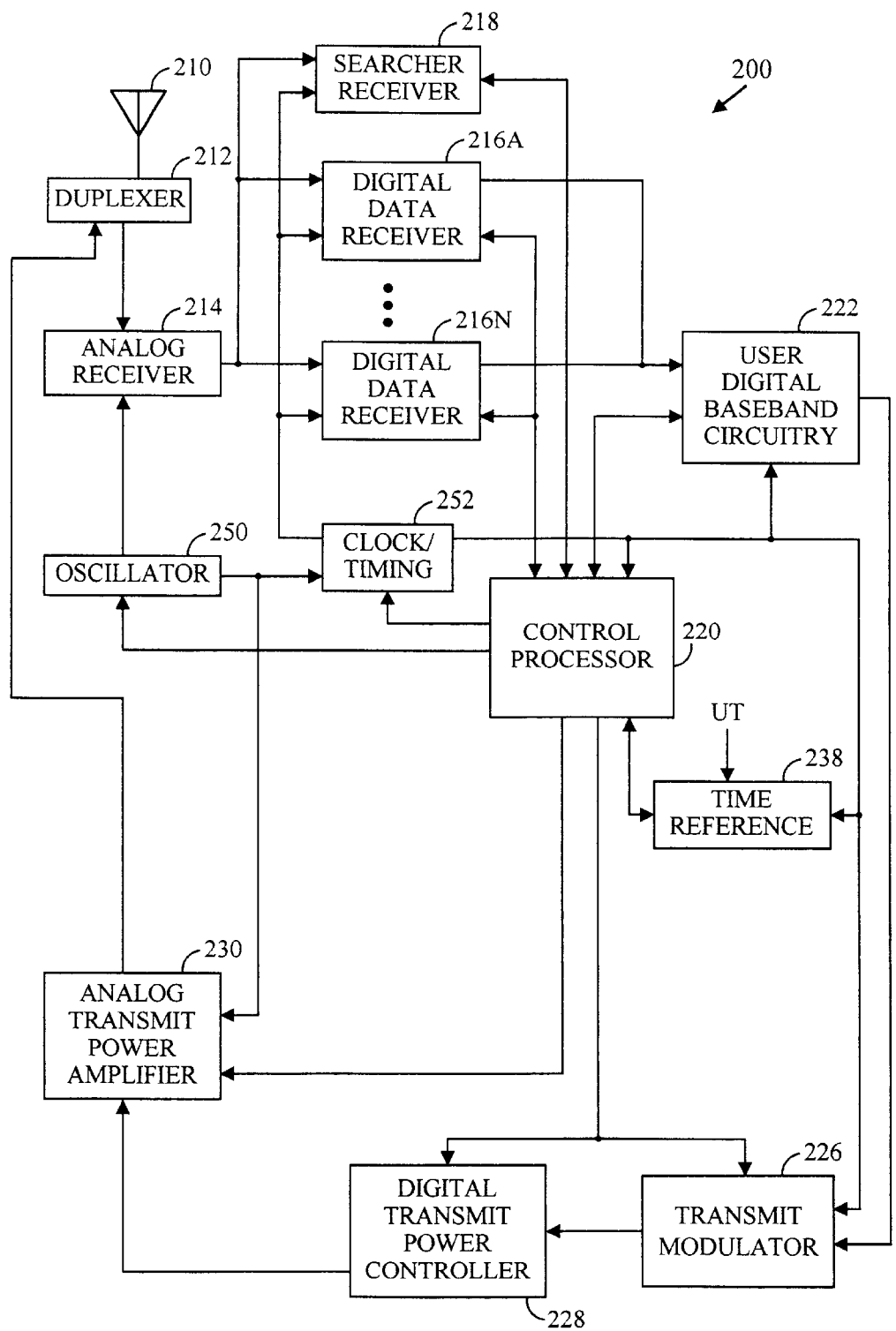
FIG. 2 is a block diagram of an example transceiver for use in a user terminal.

An exemplary transceiver 200 for use in a user terminal 106 is illustrated in FIG. 2. Transceiver 200 uses at least one antenna 210 for receiving communication signals, which are transferred to an analog receiver 214, where they are downconverted, amplified, and digitized. A duplexer element 212 is typically used to allow the same antenna to serve both transmit and receive functions. However, some systems employ separate antennas for operating at different transmit and receive frequencies.

The digital communication signals output by analog receiver 214 are transferred to at least one digital data receiver 216A and at least one searcher receiver 218. Additional digital data receivers 216B–216N can be used to obtain desired levels of signal diversity, depending on the acceptable level of unit complexity, as would be apparent to one skilled in the relevant art.

At least one user terminal control processor 220 is coupled to digital data receivers 216A–216N and searcher receiver 218. Control processor 220 provides, among other functions, basic signal processing, timing, power and handoff control or coordination, and selection of frequency used for signal carriers. Another basic control function often performed by control processor 220 is the selection or manipulation of pseudonoise (PN) code sequences or orthogonal functions to be used for processing communication signal waveforms. Signal processing by control processor 220 can include a determination of relative signal strength and computation of various related signal parameters. Such computations of signal parameters, such as timing and frequency may include the use of additional or separate dedicated circuitry to provide increased efficiency or speed in measurements or improved allocation of control processing resources.

The outputs of digital data receivers 216A–216N are coupled to digital baseband circuitry 222 within the user terminal. User digital baseband circuitry 222 comprises processing and presentation elements used to transfer information to and from a user of a user terminal. That is, signal or data storage elements, such as transient or long term digital memory; decoders; input and output devices such as display screens, speakers, keypad terminals, and handsets; A/D and D/A elements, vocoders and other voice and analog signal processing elements; etc., all form parts of the user digital baseband circuitry 222 using elements well known in the art. If diversity signal processing is employed, user digital baseband circuitry 222 can comprise a diversity combiner and decoder. Some of these elements may also operate under the control of, or in communication with, control processor 220.

When voice or other data is prepared as an output message or communications signal originated by the user terminal, user digital baseband circuitry 222 is used to receive, store, process, and otherwise prepare the desired data for transmission. User digital baseband circuitry 222 provides this data to a transmit modulator 226 operating under the control of control processor 220. The output of transmit modulator 226, along with the data rate to be transmitted, is transferred to a power controller 228 which provides output power control to a transmit power amplifier 230 for final transmission of the signal from antenna 210 to a gateway.

Digital receivers 216A–N and searcher receiver 218 are configured with signal correlation elements to demodulate or search for specific signals. Searcher receiver 218 is used to search for pilot signals, or other relatively fixed pattern strong signals, while digital receivers 216 A–N are used to demodulate other signals associated with detected pilot signals. Therefore, the outputs of these units can be monitored to determine the energy in, or frequency of, the pilot signal or other signals. These receivers also employ frequency tracking elements that can be monitored to provide current frequency and timing information to control processor 220 for signals being demodulated.

The present invention is described in terms of this example environment. Description in these terms is provided for convenience only. It is not intended that the invention be limited to application in this example environment. In fact, after reading the following description, it will become apparent to a person skilled in the relevant art how to implement the invention with other satellite-based communications systems having different architectures and levels of complexity.

III. An Accumulated Phase Measurement System

In communications receivers such as that described above with respect to FIG. 2, it is often desirable to obtain a phase measurement for a received communications signal. For example, it is often necessary to determine the position of a user terminal in a satellite-based communications system. Several approaches have been developed. Some of these approaches rely on measurements of the pilot signal frequency that are made by the user terminal. Several such approaches are described in commonly-owned copending applications entitled "Position Determination Using One Low-Earth Orbit Satellite" having application Ser. No. 08/723,751, "Passive Position Determination Using Two Low-Earth Orbit Satellites" having application Ser. No. 08/723,722, and "Unambiguous Position Determination Using Two Low-Earth Orbit Satellites" having application Ser. No. 08/723,725, which are incorporated herein by reference.

A high-accuracy frequency measurement can be obtained from an accurate measurement of the accumulated phase change of a signal over a short time interval. The required measurement is given by:

$$2\pi \cdot \int_{t_1}^{t_2} f(t) \cdot dt \quad (1)$$

where f(t)=frequency of the signal at time t. In a preferred embodiment of the present invention, the input signal is a pilot signal; however, in alternative embodiments, the present invention is used to obtain accumulated phase measurements of other similar signals.

Figure 3:
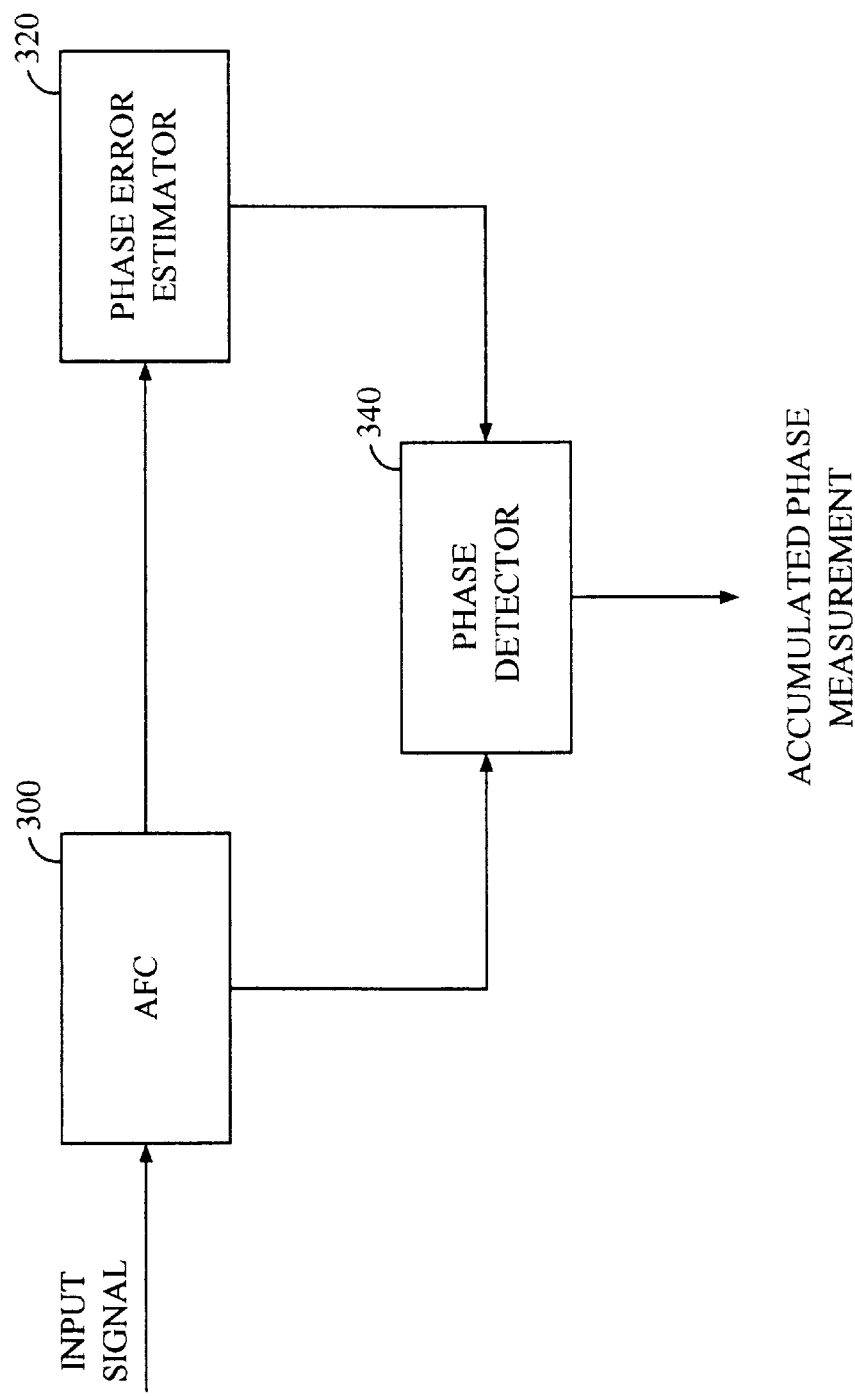
FIG. 3 is a high-level block diagram of a system for measuring the accumulated phase of an input signal according to a preferred embodiment of the present invention.

FIG. 3 is a high-level block diagram of a system for measuring the accumulated phase of an input signal according to a preferred embodiment of the present invention. In one embodiment of the present invention, the system is part of searcher receiver 218 and digital data receivers 216 in user terminal transceiver 200. In the embodiment illustrated, the system comprises Automatic Frequency Control (AFC) Loop 300, Phase Error Estimator 320, and Phase Detector 340.

Figure 4:
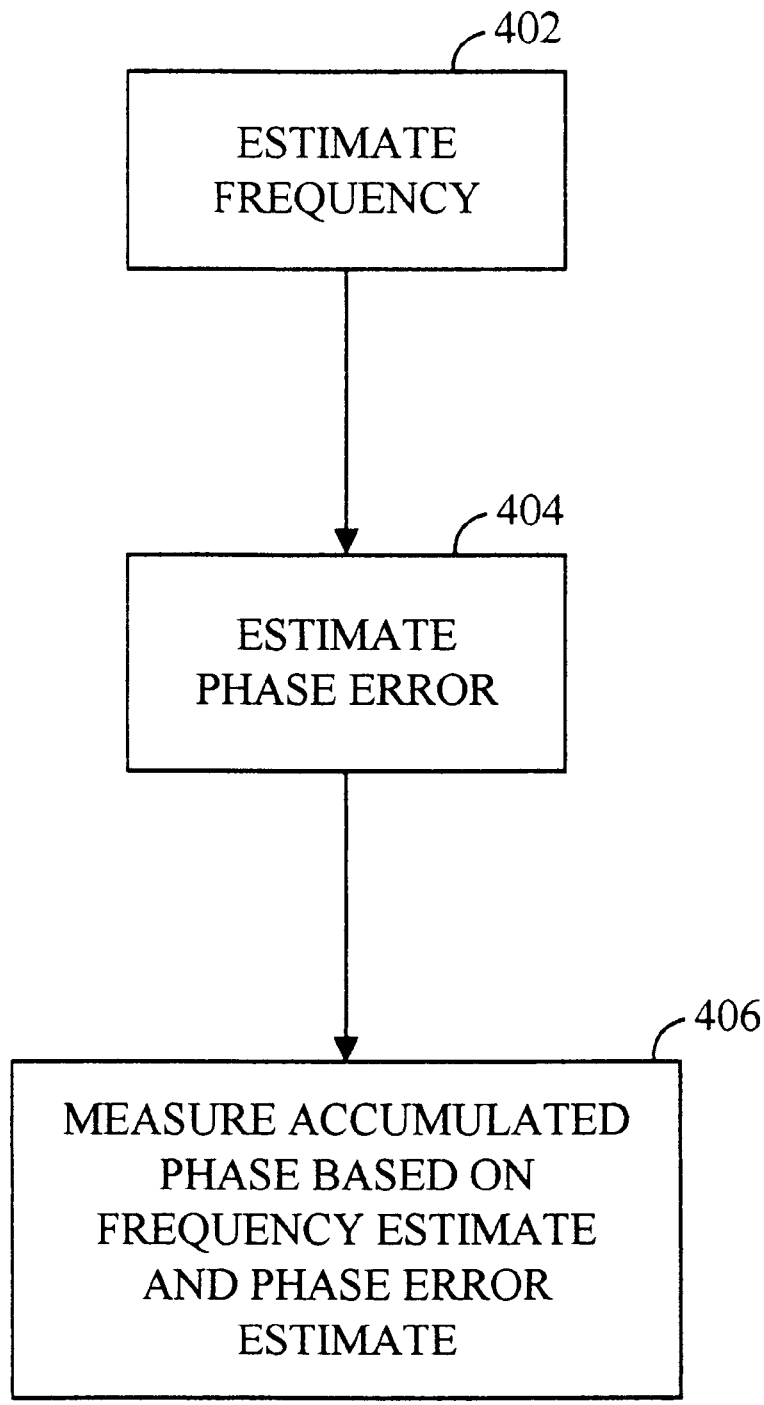
FIG. 4 is a flowchart depicting the operation of the system illustrated in FIG. 3.

FIG. 4 is a flowchart depicting the operation of the system illustrated in FIG. 3. AFC 300 generates an estimate of the frequency of the input signal, as shown in a step 402. Phase Error Estimator 320 generates an estimate of the phase error based on the frequency estimate, as shown in a step 404. Phase Detector 340 generates an accumulated phase measurement based on the frequency estimate and phase error, as shown in a step 406.

Figure 5:
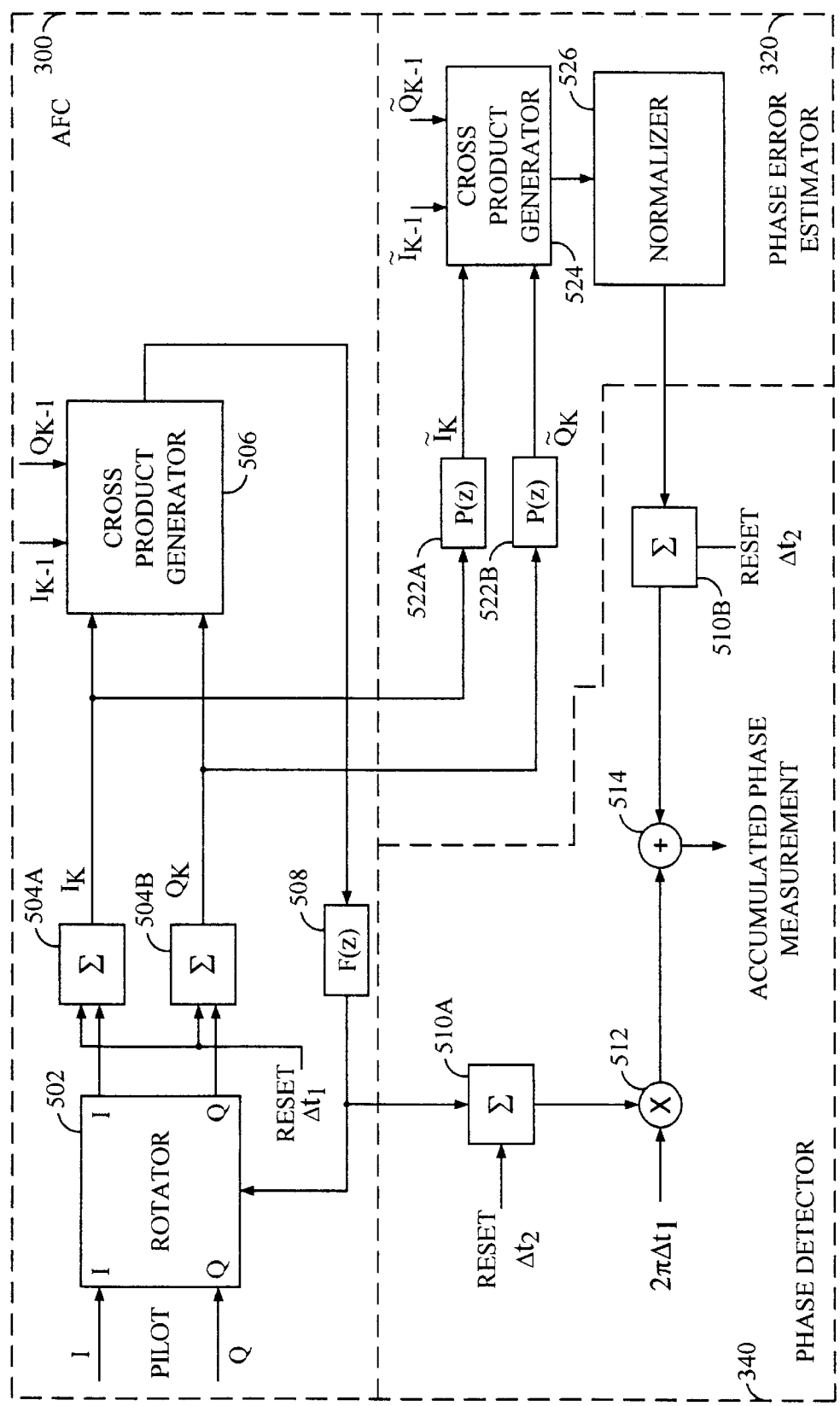
FIG. 5 is a circuit block diagram depicting the system of FIG. 3 in more detail.
Figure 6A:
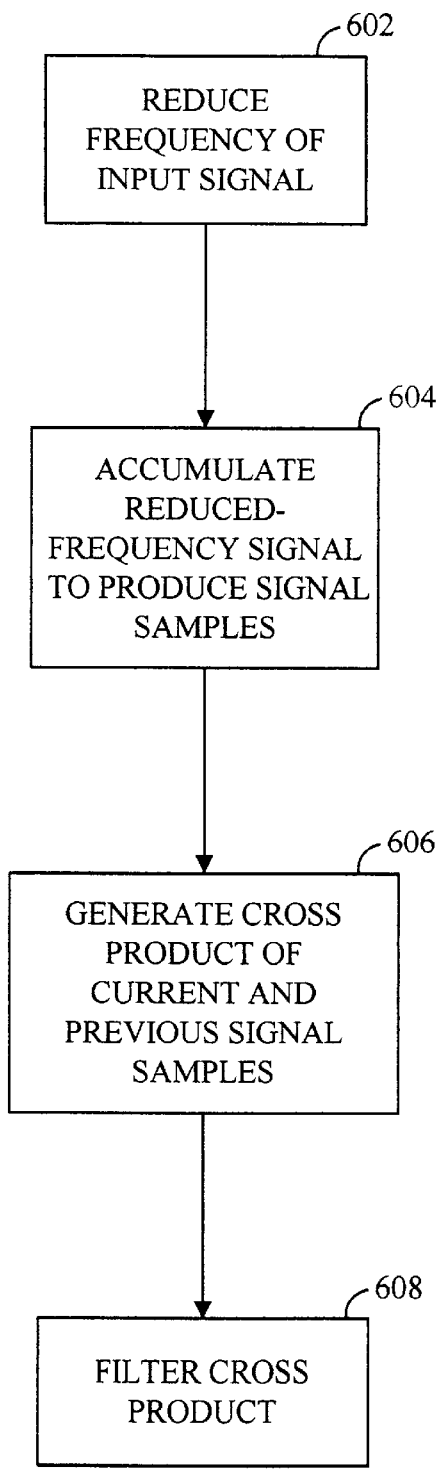
FIG. 6A is a flowchart depicting the operation of an AFC Loop according to one embodiment of the present invention.

FIG. 5 is a circuit block diagram depicting the system of FIG. 3 in more detail. FIG. 6A is a flowchart depicting the operation of AFC Loop 300 according to one embodiment of the present invention. AFC Loop 300 comprises Rotator 502, Integrate-And-Dump Accumulators 504, Cross-Product Generator 506, and Loop Filter 508. Rotator 502 receives the input signal and reduces its frequency, as shown in a step 602. In a preferred embodiment of the present invention, the input signal is a quadrature phase-shift-key (QPSK) modulated pilot signal transmitted by gateway 102.

The I-channel output of Rotator 502 is fed to Integrate-And-Dump Accumulator 504A which operates over a loop iteration period of $\Delta t_1$. In general, the loop iteration period $\Delta t_1$ is chosen according to the accuracy desired. In general, $\Delta t_1$ is chosen to be much shorter than the period of the input signal. In a preferred embodiment of the present invention $\Delta t_1$ is chosen so that $$2\pi \cdot \Delta t_1 \cdot f_{errmax} < \frac{\pi}{6} \quad (2)$$

where $f_{errmax}$ is the maximum steady-state AFC loop frequency error (that is, the steady-state output of Cross-Product Generator 506 ). In a conventional AFC loop $f_{errmax}$ is generally less than 500 Hz. In a preferred embodiment of the present invention $f_{errmax}$ is less than 100 Hz.

The Q-channel output of Rotator 502 is processed by Integrate-And-Dump Accumulator 504B in a similar fashion. Integrate-And-Dump Accumulators 504 accumulate the reduced-frequency signals to produce signal samples, as shown in a step 604. Cross-Product Generator 506 performs a cross-product operation between the current I and Q samples and the previous I and Q samples produced by Integrate-And-Dump Accumulators 504, as shown in a step 606. The output of Cross-Product Generator 506 represents the change in phase between the two samples, scaled by the energy of the pilot signal, and is given by:

$$I_{k-1} \cdot Q_k - Q_{k-1} \cdot I_k \quad (3)$$

where
- $I_k$=current in-phase component of the pilot signal at time k;
- $Q_k$=current quadrature-phase component of the pilot signal at time k;
- $I_{k-1}$=previous in-phase component of the pilot signal at time k−1; and
- $Q_{k-1}$=previous quadrature-phase component of the pilot signal at time k−1.

The output of Cross-Product Generator 506 is then filtered by Loop Filter 508, as would be apparent to one skilled in the relevant art, to produce a frequency estimate for the input signal, as shown in a step 608.

Other circuit configurations can be employed to generate a frequency estimate without departing from the spirit and scope of the present invention. However, as discussed above, the accuracy of a typical AFC loop is not sufficient for position determination. Further, an AFC loop may "miss" a cycle of the input signal entirely, leading to erroneous phase measurements. Therefore, the invention incorporates a phase error estimator to generate a phase error to supplement the frequency estimate available from AFC Loop 300.

In the embodiment illustrated in FIG. 5, Phase Error Estimator 320 comprises Phase Filters 522, Cross-Product Generator 524, and Normalizer 526. Phase Error Estimator 320 is a cascaded structure from AFC Loop 300. The use of such a cascaded structure produces two advantages. First, it permits any similar off-the-shelf AFC loop to be used in the present invention, without significant modifications, to obtain accumulated phase measurements. Second, it provides an open-loop architecture that is well-suited to fading signals. In a closed-loop architecture, the fluctuations in input signal strength for a fading signal are fed back and thus enhanced. Thus, because an open-loop architecture has no feedback, it is more suitable for fading signals.

Figure 6B:
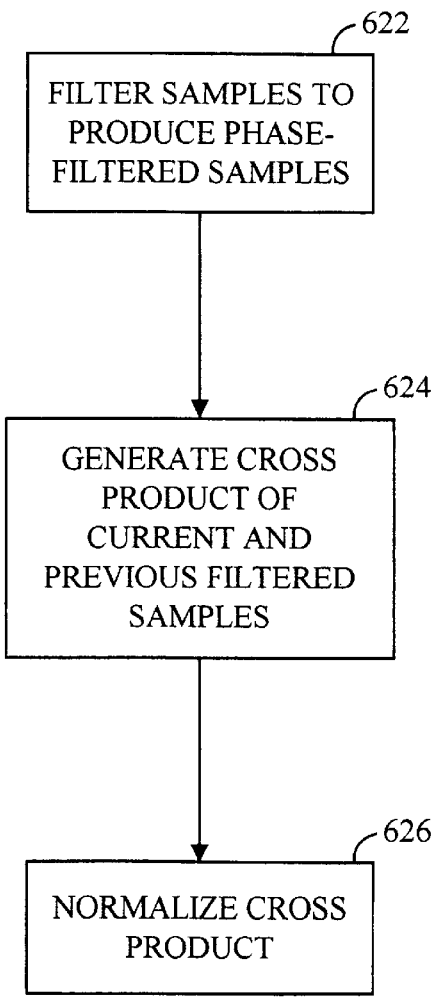
FIG. 6B is a flowchart depicting the operation of a Phase Error Estimator according to one embodiment of the present invention.

FIG. 6B is a flowchart depicting the operation of Phase Error Estimator 320 according to one embodiment of the present invention. The output of Integrate-And-Dump Accumulator 504A is filtered by Phase Filter 522A; likewise, the output of Integrate-And-Dump Accumulator 504B is filtered by Phase Filter 522B, as shown in a step 622. This filtering operation improves the signal-to-noise ratio of the signal, which yields improved accuracy in the phase measurement. The design and operation of Phase Filters 522 will be apparent to one skilled in the relevant art. Cross-Product Generator 524 performs a cross-product operation between the current and previous outputs of Phase Filters 522, as shown in a step 624. The output of Cross-Product Generator 524 is normalized by Normalizer 526 to produce a phase error, as shown in a step 626. The phase error is given by:

$$\frac{\bar{I}_{k-1} \cdot \bar{Q}_k - \bar{Q}_{k-1} \cdot \bar{I}_k}{\sqrt{(\bar{I}_{k-1}^2 + \bar{Q}_{k-1}^2) \cdot (\bar{I}_k^2 + \bar{Q}_k^2)}} \quad (4)$$

where:

$\bar{I}_k$=current in-phase component of the phase-filtered pilot signal at time k;

$\bar{Q}_k$=current quadrature-phase component of the phase-filtered pilot signal at time k;

$\bar{I}_{k-1}$=previous in-phase component of the phase-filtered pilot signal at time k−1; and $\bar{Q}_k$=previous quadrature-phase component of the phase-filtered pilot signal at time k−1.

Other circuit configurations can be employed to generate a phase error without departing from the spirit and scope of the present invention.

Figure 6C:
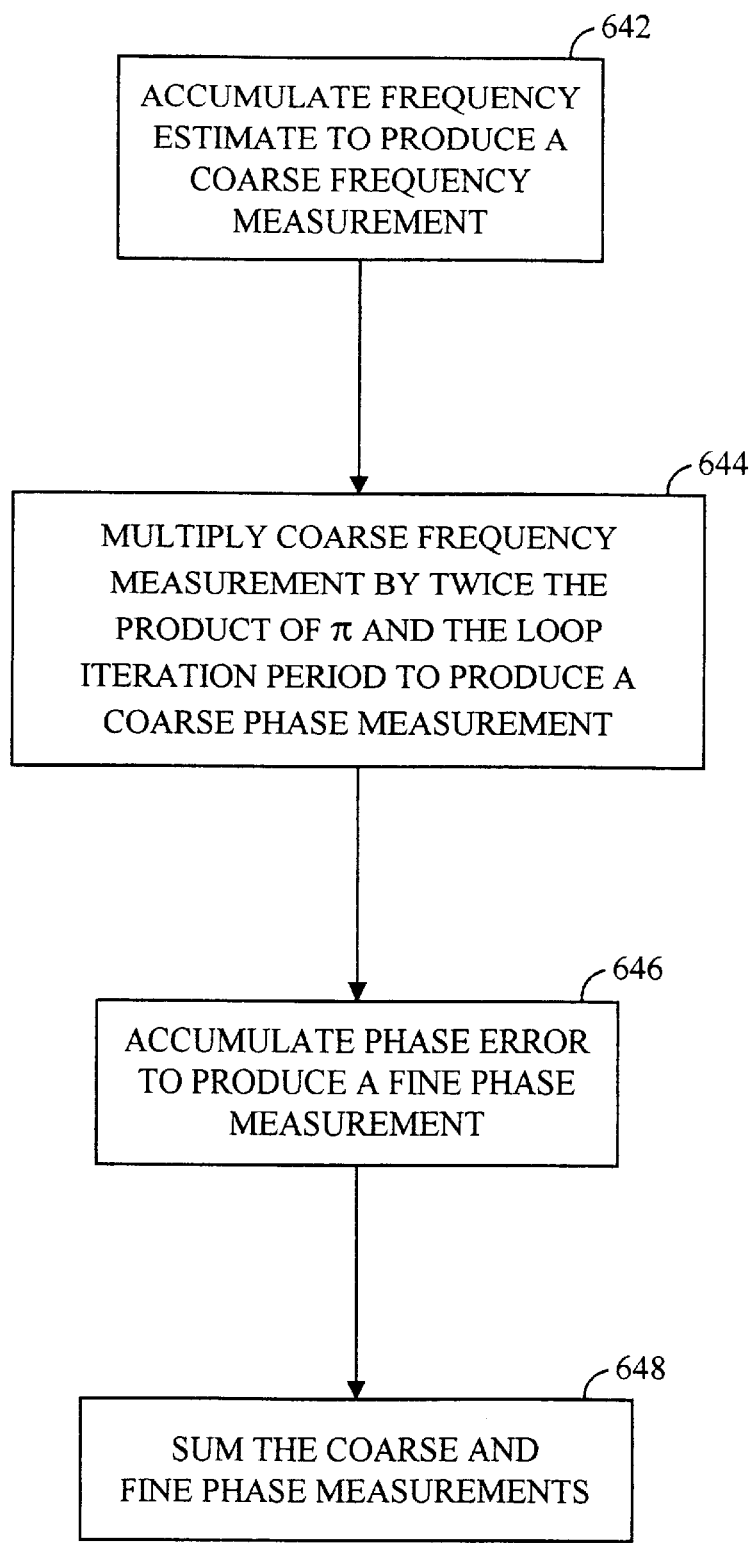
FIG. 6C is a flowchart depicting the operation of a Phase Detector according to one embodiment of the present invention.

In the embodiment illustrated in FIG. 5, Phase Detector 340 comprises Integrate-And-Dump Accumulators 510a,b, Multiplier 512, and Summer 514. FIG. 6C is a flowchart depicting the operation of Phase Detector 340 according to one embodiment of the present invention. In the illustrated embodiment, AFC Loop 300 produces a frequency estimate which is fed to Integrate-And-Dump Accumulator 510A to produce a coarse frequency estimate, as shown in a step 642. The coarse frequency estimate is multiplied in Multiplier 512 by twice the product of Δ and the loop iteration period $\Delta t_1$ of AFC Loop 300 to produce a coarse phase measurement, as shown in a step 644. The coarse phase measurement over a measurement interval $\Delta t_2$ is given by:

$$2\pi \cdot \sum_{k=t_1}^{t_2} \bar{f}_k \cdot \Delta t_1 \quad (5)$$

where $\bar{f}_k$=AFC loop frequency estimate at time k $\Delta t_1$=AFC loop iteration period.

The duration of measurement interval $\Delta t_2 = t_2 - t_1$ is selected according to various factors, including positioning requirements, as would be apparent to one skilled in the relevant art. In a preferred embodiment of the present invention, the duration of measurement interval $\Delta t_2$ is approximately two seconds.

Phase Error Estimator 320 produces a phase error, which is fed to Integrate-And-Dump Accumulator 510B. Integrate-And-Dump Accumulator 510B, which operates over the measurement interval $\Delta t_2$, produces a fine phase measurement, as shown in a step 646.

The coarse and fine phase measurements are summed by Summer 514 to produce an accumulated phase measurement for the input signal, as shown in a step 648.

IV. Conclusion

The previous description of the preferred embodiments is provided to enable any person skilled in the art to make or use the present invention. While the invention has been particularly shown and described with reference to preferred embodiments thereof, it will be understood by those skilled in the art that various changes in form and details may be made therein without departing from the spirit and scope of the invention.

What we claim as our invention is:

1. An apparatus for accurately measuring the total accumulated phase error of an input signal over a pre-selected measurement interval comprising:

an automatic frequency control loop for generating an estimate of the frequency of the input signal;

a phase error estimator for receiving the frequency estimate and for generating a phase error based on said frequency estimate; and a phase detector for generating an accumulated total phase error measurement over said measurement interval based on said frequency estimate and said phase error by summing phase error generated by said phase error estimator over time so as to provide a total phase error.

2. An apparatus for accurately measuring the accumulated phase of an input signal over a measurement interval comprising:

an automatic frequency control loop for generating a frequency estimate of the frequency of the input signal, wherein said automatic frequency control loop comprises:

a rotator for reducing the frequency of the input signal;

first and second integrate-and-dump accumulators, coupled to respective outputs of said rotator, operating over a loop iteration period;

cross-product means, coupled to the outputs of said first and second integrate-and-dump accumulators, for generating a cross-product signal; and a filter for filtering said cross-product signal to produce a signal representing said frequency estimate;

a phase error estimator for generating a phase error based on said frequency estimate; and a phase detector for generating an accumulated phase measurement based on said frequency estimate and said phase error.

3. The apparatus of claim 2, wherein said phase error estimator comprises:

first and second further filters, for filtering respective outputs of said first and second integrate-and-dump accumulators; and further cross-product means, coupled to respective outputs of said first and second further filters, for producing a signal representing said phase error.

4. The apparatus of claim 3, wherein said phase detector comprises:

a third integrate-and-dump accumulator, operating over a measurement interval, for generating a coarse frequency measurement based on said frequency estimate;

a multiplier, coupled to said third integrate-and-dump accumulator, for multiplying said coarse frequency measurement by twice the product of $\pi$ and said loop iteration period to produce a coarse phase measurement;

a fourth integrate-and-dump accumulator operating over said measurement interval to produce a fine phase measurement; and a summer for producing a signal representing said accumulated phase measurement based on said coarse and fine phase measurements.

5. A method for accurately measuring the total accumulated phase error of an input signal over a pre-selected measurement interval comprising the steps of:

generating an estimate of the frequency of the input signal;

generating a phase error based on said frequency estimate; and generating an accumulated a total phase error measurement based on said frequency estimate and said phase error by summing phase error generated by said phase error estimator over time so as to provide a total phase error.

6. A method for accurately measuring the accumulated phase of an input signal over a measurement interval comprising the steps of:

generating a frequency estimate of the frequency of the input signal, wherein said step of generating a frequency estimate comprises the steps of:
reducing the frequency of said input signal to produce a reduced-frequency signal;
accumulating said reduced-frequency signal over a loop iteration period to produce signal samples;
generating a cross-product of current and previous ones of said signal samples to produce a cross-product signal; and
filtering said cross-product signal to produce a signal representing said frequency estimate;

generating a phase error based on said frequency estimate; and generating an accumulated phase measurement based on said frequency estimate and said phase error.

7. The method of claim 6, wherein said step of generating a phase error comprises the steps of:

filtering said signal samples to produce phase-filtered signal samples;

generating a cross-product of current and previous ones of said phase-filtered signal samples to produce a further cross-product signal; and normalizing said further cross-product signal to produce a signal representing said phase error.

8. The method of claim 7, wherein said step of generating an accumulated phase measurement comprises the steps of:

accumulating said frequency estimate over a measurement interval to generate a coarse frequency measurement;

multiplying said coarse frequency measurement by twice the product of $\pi$ and said loop iteration period to produce a coarse phase measurement;

accumulating said phase error over said measurement interval to produce a fine phase measurement; and summing said coarse and fine phase measurements to produce a signal representing an accumulated phase measurement.

9. The method of claim 6, wherein said step of generating a frequency estimate is performed by an automatic frequency control loop.

10. The method of claim 6, wherein said step of generating a phase error is performed by a phase error estimator.

11. An apparatus for accurately measuring the total accumulated phase error of an input signal over a pre-selected measurement interval comprising:

frequency estimating means for generating an estimate of the frequency of the input signal;

phase error estimating means for generating a phase error based on said frequency estimate; and phase detector means for generating an accumulated total phase error measurement over said measurement interval based on said frequency estimate and said phase error by summing phase error generated by said phase error estimator over time so as to provide a total phase error.

12. An apparatus, for accurately measuring the accumulated phase of an input signal over a measurement interval comprising:

frequency estimating means generating a frequency estimate of the frequency of the input signal, wherein said frequency estimating means comprises:
means for reducing the frequency of said input signal to produce a reduced-frequency signal;
means for accumulating said reduced-frequency signal over a loop iteration period to produce signal samples;
means for generating a cross-product of current and previous ones of said signal samples to produce a cross-product signal; and
means for filtering said cross-product signal to produce a signal representing said frequency estimate;

phase error estimating means for generating a phase error based on said frequency estimate; and phase detector means for generating an accumulated phase measurement based on said frequency estimate and said phase error.

13. The apparatus of claim 12, wherein said phase error estimating means comprises:

means for filtering said signal samples to produce phase-filtered signal samples;

means for generating a cross-product of current and previous ones of said phase-filtered signal samples to produce a further cross-product signal; and means for normalizing said further cross-product signal to produce a signal representing said phase error.

14. The apparatus of claim 13, wherein said phase detector means comprises:

means for accumulating said frequency estimate over a measurement interval to generate a coarse frequency measurement;

means for multiplying said coarse frequency measurement by twice the product of $\pi$ and said loop iteration period to produce a coarse phase measurement;

means for accumulating said phase error over said measurement interval to produce a fine phase measurement; and means for summing said coarse and fine phase measurements to produce a signal representing an accumulated phase measurement.

15. The apparatus of claim 12, wherein said frequency estimating means includes an automatic frequency control loop.

16. The apparatus of claim 12, wherein said phase error estimating means includes a phase error estimator.

* * * * *